United States Patent
Schultz

(10) Patent No.: US 12,205,897 B2
(45) Date of Patent: Jan. 21, 2025

(54) STANDARD CELL DESIGN ARCHITECTURE FOR REDUCED VOLTAGE DROOP UTILIZING REDUCED CONTACTED GATE POLY PITCH AND DUAL HEIGHT CELLS

(71) Applicant: Advanced Micro Devices, Inc., Santa Clara, CA (US)

(72) Inventor: Richard T. Schultz, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 56 days.

(21) Appl. No.: 17/483,672

(22) Filed: Sep. 23, 2021

(65) Prior Publication Data
US 2023/0092184 A1    Mar. 23, 2023

(51) Int. Cl.
| | |
|---|---|
| *H01L 23/528* | (2006.01) |
| *H01L 21/768* | (2006.01) |
| *H01L 23/522* | (2006.01) |
| *H01L 27/02* | (2006.01) |

(52) U.S. Cl.
CPC .... *H01L 23/5286* (2013.01); *H01L 21/76838* (2013.01); *H01L 23/5226* (2013.01); *H01L 27/0207* (2013.01)

(58) Field of Classification Search
CPC ............. H01L 23/5286; H01L 23/5226; H01L 21/76838; H01L 27/0207
USPC ...................................................... 257/773
See application file for complete search history.

(56) References Cited

U.S. PATENT DOCUMENTS

| | | |
|---|---|---|
| 4,851,892 A | 7/1989 | Anderson et al. |
| 5,889,329 A | 3/1999 | Rostoker et al. |
| 6,100,101 A | 8/2000 | Marathe et al. |
| 6,242,767 B1 | 6/2001 | How et al. |
| 6,609,242 B1 | 8/2003 | Slade |
| 7,064,074 B2 | 6/2006 | Van Bentum et al. |

(Continued)

FOREIGN PATENT DOCUMENTS

| | | |
|---|---|---|
| WO | 2007073599 A1 | 7/2007 |
| WO | 2021041687 A1 | 3/2021 |

OTHER PUBLICATIONS

International Search Report and Written Opinion in International Application No. PCT/US2022/076209, dated Dec. 21, 2022, 11 pages.

(Continued)

*Primary Examiner* — Tu-Tu V Ho
(74) *Attorney, Agent, or Firm* — Kowert, Hood, Munyon, Rankin & Goetzel, P.C.; Rory D. Rankin

(57) ABSTRACT

A system and method for creating chip layout are described. In various implementations, a standard cell uses unidirectional tracks for power connections and signal routing. A single track of the metal one layer that uses a minimum width of the metal one layer is placed within a pitch of a single metal gate. The single track of the metal one layer provides a power supply reference voltage level or ground reference voltage level. This placement of the single track provides a metal one power post contacted gate pitch (CPP) of 1 CPP. To further reduce voltage droop, a standard cell uses dual height and half the width of a single height cell along with placing power posts with 1 CPP. The placement of the multiple power rails of the dual height cell allows alignment of the power rails with power rails of other standard cells.

20 Claims, 8 Drawing Sheets

(56) References Cited

U.S. PATENT DOCUMENTS

| | | |
|---|---|---|
| 8,264,007 B2 | 9/2012 | Becker et al. |
| 8,356,268 B2 | 1/2013 | Becker et al. |
| 8,561,003 B2 | 10/2013 | Kawa et al. |
| 8,680,626 B2 | 3/2014 | Smayling et al. |
| 9,400,862 B2 | 7/2016 | Kawa et al. |
| 9,431,383 B2 | 8/2016 | Baek et al. |
| 9,460,259 B2 | 10/2016 | Baek et al. |
| 9,502,351 B1 | 11/2016 | Sahu |
| 9,553,028 B2 | 1/2017 | Xie et al. |
| 9,589,847 B1 | 3/2017 | Chi et al. |
| 9,633,987 B2 | 4/2017 | Smayling et al. |
| 9,659,939 B1 | 5/2017 | Cao et al. |
| 9,691,768 B2 | 6/2017 | Moroz et al. |
| 9,704,995 B1 | 7/2017 | Schultz |
| 9,837,398 B1 | 12/2017 | Rowhani |
| 9,837,437 B2 | 12/2017 | Baek et al. |
| 10,438,937 B1 | 10/2019 | Schultz |
| 10,796,061 B1 * | 10/2020 | Schultz ............ H01L 27/0207 |
| 11,742,289 B2 | 8/2023 | Schultz |
| 2003/0023937 A1 | 1/2003 | McManus et al. |
| 2005/0212562 A1 | 9/2005 | Gliese et al. |
| 2007/0063244 A1 | 3/2007 | Ho et al. |
| 2007/0157144 A1 | 7/2007 | Mai et al. |
| 2007/0278528 A1 | 12/2007 | Ato et al. |
| 2007/0284619 A1 | 12/2007 | Kanno et al. |
| 2008/0283925 A1 | 11/2008 | Berthold et al. |
| 2009/0187871 A1 | 7/2009 | Cork |
| 2010/0127333 A1 | 5/2010 | Hou et al. |
| 2010/0148219 A1 | 6/2010 | Shimizu |
| 2010/0287518 A1 | 11/2010 | Becker |
| 2013/0026572 A1 | 1/2013 | Kawa et al. |
| 2013/0087834 A1 | 4/2013 | Park et al. |
| 2013/0146986 A1 | 6/2013 | Rashed et al. |
| 2013/0154128 A1 | 6/2013 | Wang et al. |
| 2013/0155753 A1 | 6/2013 | Moon et al. |
| 2013/0295756 A1 | 11/2013 | Yuan et al. |
| 2013/0313513 A1 | 11/2013 | Cappellani et al. |
| 2013/0334613 A1 | 12/2013 | Moroz |
| 2014/0145342 A1 | 5/2014 | Schultz et al. |
| 2014/0252650 A1 | 9/2014 | Utsumi et al. |
| 2014/0264742 A1 | 9/2014 | Yen et al. |
| 2015/0048425 A1 | 2/2015 | Park et al. |
| 2015/0052494 A1 | 2/2015 | Tarabbia et al. |
| 2015/0069531 A1 | 3/2015 | Naczas et al. |
| 2015/0269302 A1 | 9/2015 | Katta et al. |
| 2015/0302917 A1 | 10/2015 | Grover et al. |
| 2016/0163644 A1 | 6/2016 | Woo et al. |
| 2016/0276287 A1 | 9/2016 | Iwabuchi |
| 2016/0284705 A1 | 9/2016 | Chung |
| 2017/0011999 A1 | 1/2017 | Heo |
| 2017/0125292 A1 | 5/2017 | Greene et al. |
| 2017/0154848 A1 | 6/2017 | Fan et al. |
| 2017/0263506 A1 | 9/2017 | Bouche et al. |
| 2017/0294448 A1 | 10/2017 | Debacker et al. |
| 2017/0323902 A1 | 11/2017 | Zeng |
| 2017/0365621 A1 | 12/2017 | Becker et al. |
| 2017/0371995 A1 | 12/2017 | Correale, Jr. et al. |
| 2017/0373090 A1 | 12/2017 | Correale, Jr. et al. |
| 2018/0033701 A1 | 2/2018 | Bouche et al. |
| 2018/0040631 A1 | 2/2018 | Kim |
| 2018/0090440 A1 | 3/2018 | Schultz |
| 2018/0183414 A1 | 6/2018 | Guo et al. |
| 2018/0190670 A1 | 7/2018 | Ryckaert |
| 2018/0218981 A1 | 8/2018 | Lin et al. |
| 2018/0314785 A1 | 11/2018 | Schultz |
| 2018/0315709 A1 | 11/2018 | Schultz |
| 2019/0065650 A1 | 2/2019 | Pelloie |
| 2019/0155979 A1 | 5/2019 | Schultz |
| 2019/0363167 A1 | 11/2019 | Schultz |
| 2019/0385999 A1 | 12/2019 | Berzins |
| 2020/0019666 A1 | 1/2020 | Lai et al. |

OTHER PUBLICATIONS

Xie et al., "5nm FinFET Standard Cell Library Optimization and Circuit Synthesis in Near- and Super-Threshold Voltage Regimes", 2014 IEEE Computer Society Annual Symposium on VLSI, Jul. 2014, pp. 424-429.

Cui et al., "7nm FinFET Standard Cell Layout Characterization and Power Density Prediction in Near- and Super-Threshold Voltage Regimes", International Green Computing Conference, Nov. 2014, 7 pages.

International Search Report and Written Opinion in International Application No. PCT/US2018/029767, dated Jul. 11, 2018, 14 pages.

International Search Report and Written Opinion in International Application No. PCT/US2018/029760, dated Jul. 16, 2018, 16 pages.

Non-Final Office Action in U.S. Appl. No. 15/636,245, dated May 18, 2018, 30 pages.

Final Office Action in U.S. Appl. No. 15/636,245, dated Jan. 14, 2019, 31 pages.

Non-Final Office Action in U.S. Appl. No. 15/636,245, dated May 29, 2019, 23 pages.

Non-Final Office Action in U.S. Appl. No. 15/636,278, dated Apr. 5, 2019, 12 pages.

International Search Report and Written Opinion in International Application No. PCT/US2017/052775, dated Mar. 26, 2018, 17 pages.

International Search Report and Written Opinion in International Application No. PCT/US2018/052369, dated Jan. 7, 2019, 16 pages.

Non-Final Office Action in U.S. Appl. No. 15/275,028, dated Sep. 28, 2018, 10 pages.

Non-Final Office Action in U.S. Appl. No. 15/819,879, dated Mar. 18, 2019, 10 pages.

Final Office Action in U.S. Appl. No. 15/275,028, dated May 16, 2019, 12 pages.

* cited by examiner

STANDARD CELL DESIGN ARCHITECTURE FOR REDUCED VOLTAGE DROOP UTILIZING REDUCED CONTACTED GATE POLY PITCH AND DUAL HEIGHT CELLS

BACKGROUND

Description of the Relevant Art

In order to shorten the design cycle for semiconductor chips, manual full-custom designs are replaced with automation where possible. In some cases, a standard cell layout is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, pin access, and so on. Therefore, designers manually create these cells to achieve better results for the multiple characteristics or rewrite the rules for the place-and-route tool. However, many times, the layout tools and rules are setup for planer devices, rather than for the relatively recent non-planar devices.

Generally, the standard cell layouts use at least one power rail for the supply voltage connections also referred to as the VDD power rail and one power rail for the ground connections also referred to as the VSS power rail. In some cases, the power and ground rails use relatively long wires utilizing multiple metal layers such as horizontal metal zero, vertical metal one, horizontal metal two and vertical metal three in addition to the corresponding vias. In other cases, fixed location posts are used within the standard cell to make the power and ground connections. Each of these cases reduces flexibility for placement of the standard cell in the semiconductor chip and for alleviating signal routing congestion. Real-time routing optimization is limited or completely removed.

Both power consumption and voltage droop of modern integrated circuits (IC's) has become an increasing design issue with each generation of semiconductor chips. IC power dissipation and voltage droop constraints are not only an issue for portable computers and mobile communication devices, but also for high-performance superscalar microprocessors, which include multiple processor cores, or cores, and multiple pipelines within a core. The geometric dimensions of devices and metal routes on each generation of cores are decreasing. Superscalar designs increase the density of integrated circuits on a die with multiple pipelines, larger caches, and more complex logic. Therefore, the number of nodes and buses that switch per clock cycle significantly increases.

In view of the above, efficient methods and systems for creating layout for a chip are desired.

Figure 1:
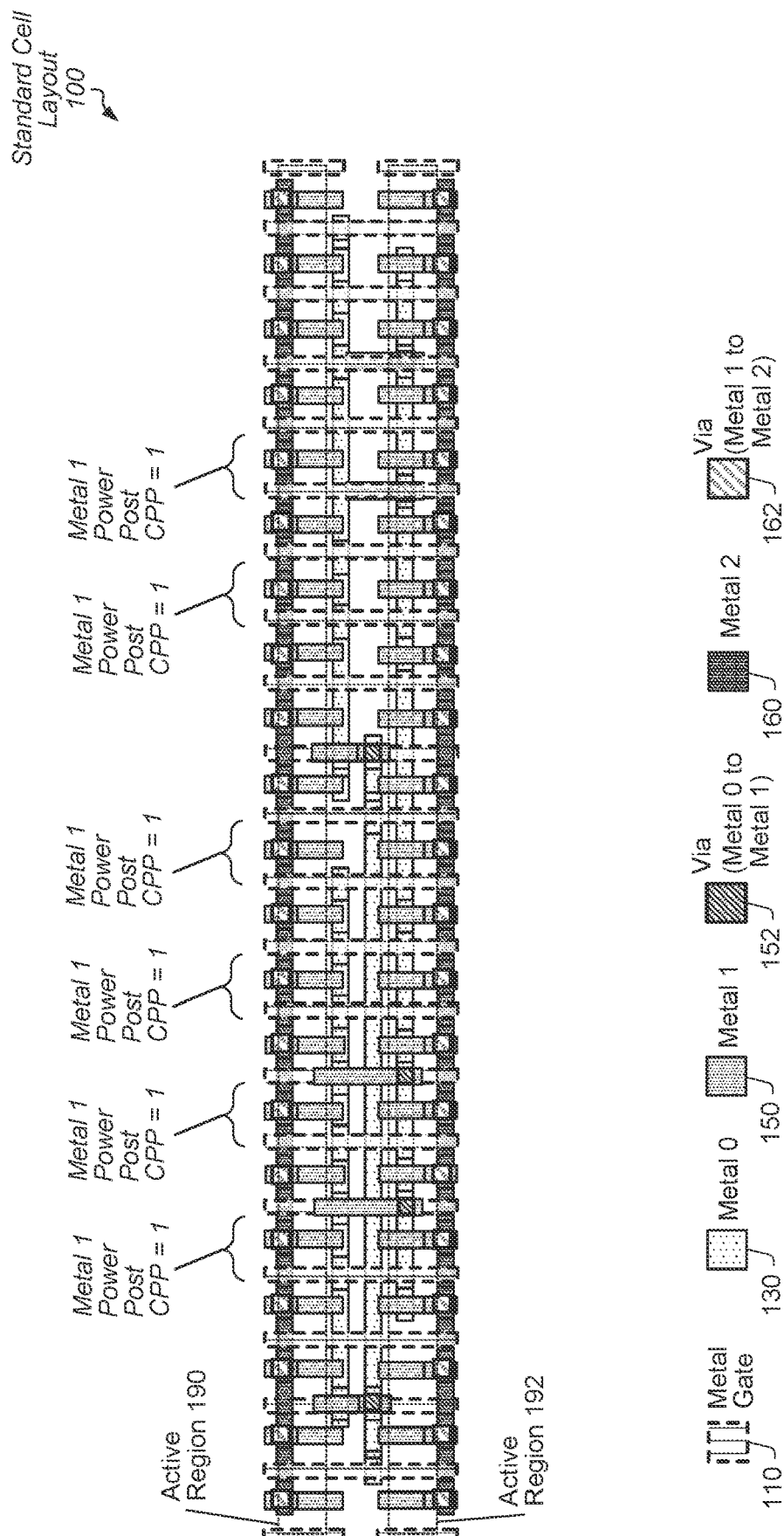
FIG. 1 is a generalized diagram of a top view of a standard cell layout utilizing techniques to reduce voltage droop.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for laying out power grid connections for standard cells are contemplated. In various implementations, an integrated circuit includes one or more standard cells, and at least one standard cell includes unidirectional tracks for routing signals in one or more metal layers. Signal routes with no bends and no L-shapes are referred to as unidirectional routes. In contrast, signal routes with bends and/or L-shapes are referred to as bidirectional routes. Bidirectional routes create a significant on-die area penalty. In some implementations, a single track of the metal one layer uses a minimum width of the metal one layer and a power post of the metal one layer is placed within a pitch of a single metal gate.

For the standard cell, a maximum ratio of a first number of tracks of a metal one layer that can fit in an area with a minimum width for the metal one layer to a second number of tracks of a metal gate layer that can fit in the same area with a minimum width for the metal gate layer and still provide a processing yield above a threshold is referred to as the "gear ratio". Each of the first number and the second number is a positive, non-zero integer. In previous designs, the gear ratio was three to two, or the standard cells are capable of including three tracks of the metal one layer in an area that also includes two tracks of metal gate. With advanced development of semiconductor fabrication lithography techniques, the gear ratio increases, such as from a gear ratio of three to two (3:2) to a gear ratio of two to one (2:1). The gear ratio is also related to minimize a number of contacted gate pitches (CPP), and a ratio of one power post in the metal one layer (Metal1 or M1) to each metal gate corresponds to a metal one power post CPP of 1, or 1 CPP.

The acronym CPP is used herein since metal gates previously were formed using polysilicon so that there would be a number of contacted polysilicon (poly) pitches, or CPP, in the layout. However, metal gates are now formed from a variety of other materials. Titanium nitride (TiN) is one example of material used to form metal gates. Although other materials are available to form the metal gates, the acronym CPP is still used to indicate the number of contacted gate pitches. As metal one power post CPP decreases from 4 CPP to 2 CPP to 1 CPP, the number of vias (contacts) increases, so the overall resistance of vias decreases. For example, the resistance of the vias is halved with each reduction in CPP. The same amount of current is being conducted, but the via resistance decreases, so the voltage droop decreases.

A power post of the standard cell in the metal one layer is routed using a minimum length for the metal one layer as defined by design rules. The minimum length provides signal pins, such as input, output and intermediate signals, to a chip level place-and-route tool while still satisfying the minimum area requirements for the metal one layer. The minimum length also reduces electromigration effects and provides area for signal routing for neighboring cells. A custom cell designer or an automated synthesis tool places a power post in the track of the metal one layer to provide one of multiple power supply voltage reference levels and ground reference voltage levels used by the integrated circuit.

To further reduce voltage droop, a standard cell uses dual height and half the width of a single height cell along with placing metal one power posts with 1 CPP. When using dual height, each power rail of the metal two layer has a reduced length and a smaller number of metal gates used for driving an output signal. In various implementations, one or more standard cells of the multi-cell layout includes a first power rail in a first track of the metal two layer and a second power rail in a second track different from the first track of the metal two layer. Each of the first power rail and the second power rail provides a first voltage reference to the given standard cell. The first voltage reference is one of the multiple power supply voltage references and the ground reference voltages used by the integrated circuit. The standard cell that uses the first power rail and the second power rail is a dual height cell that reduces the overall length of a given power rail of the metal two layer.

The above standard cell also uses a third power rail in a third track of the metal two layer and a fourth power rail in a fourth track of the metal two layer. Each of the third power rail and the fourth power rail provides a second voltage reference level to the given standard cell. The second voltage reference level is different from the first voltage reference level, and the second voltage reference level is one of the multiple power supply voltage reference levels and the ground voltage reference levels used by the integrated circuit. In an implementation, the first power rail and the second power rail are routed in the center of the standard cell with sufficient spacing between them to satisfy design rules. The third power rail is routed at the top of the standard cell, and the fourth power rail is routed at the bottom of the standard cell. One or more of a custom cell designer and an automated synthesis tool places multiple standard cells in a multi-cell layout. Multiple standard cells of varying type are used to create an array at the chip level. The placement of the first power rail to the fourth power rail of the dual height cell allows alignment of the power rails with power rails of other standard cells.

Referring to FIG. 1, a generalized block diagram of a top view of a standard cell layout 100 is shown that utilizes techniques to reduce voltage droop. In the illustrated implementation, the standard cell layout 100 is for a buffer with back-to-back inverters. However, in other implementations, the characteristics and techniques used for standard cell layout 100 is used for a variety of other types of Boolean gates and complex gates. The p-type metal oxide semiconductor (PMOS) field effect transistors FETS (or pfets) are at the top of the standard cell layout 100. The n-type metal oxide semiconductor (NMOS) FETS (or nfets) are at the bottom of the standard cell layout 100. As used herein, a "transistor" is also referred to as a "semiconductor device" or a "device." The active region 190 includes doped silicon for creating p-type transistors. For example, the silicon substrate in the active region 190 has been doped with Boron or Gallium during a semiconductor fabrication process. The active region 192 includes doped silicon for creating n-type transistors. For example, the silicon substrate in the active region 190 has been doped with Phosphorous or Arsenic during a semiconductor fabrication process. Although the orientation of the standard cell layout 100 (or layout 100) is shown to have the p-type transistors at the top and the n-type transistors at the bottom, other orientations are possible and contemplated.

In various implementations, the devices (or transistors) in the standard cell layout 100 are non-planar devices. Non-planar transistors are used in semiconductor processing for reducing short channel effects. Tri-gate transistors, Fin field effect transistors (FETs) and gate all around (GAA) transistors are examples of non-planar transistors. As shown, the standard cell layout 100 uses metal gate 110 in a vertical direction, metal 0 (M0 or Metal0) 130 for local interconnections in the horizontal direction, metal 1 (M1 or Metal1) 150 for local interconnections in the vertical direction, vias (or contacts) 152 for connecting the horizontal interconnect Metal0 130 to the vertical interconnect Metal1 150, metal 2 (M2 or Metal2) 160 for horizontal power rails, and vias (or contacts) 162 for connecting the vertical interconnect Metal1 150 to the horizontal interconnect Metal2 160. For ease of illustration, multiple layers are not shown, which are used to complete the circuitry of the back-to-back inverters of layout 100. Examples of these layers are trench silicide contacts for the source and drain regions in the vertical direction, contacts for connecting the metal gate 110 to Metal0 130, and contacts 142 for connecting the trench silicide contacts to Metal0 130.

On the far-left end and the far-right end of layout 100 are metal gates 110 used as dummy gates. Dummy gates are typically used to provide electrical isolation between regions. Although in various implementations, a dummy gate uses a metal gate, the gate region is formed over an insulation layer, rather than an active silicon layer such as an n-type or p-type diffusion layer. The isolation layer uses a silicon nitride layer, a silicon oxide layer, such as a silicon dioxide layer, or another type of dielectric layer. Therefore, should voltage levels be applied on the dummy gate and one or more of the regions on either side of the dummy gate, such as source/drain regions, no electrical path is provided and no current flows between the source/drain regions. The fabrication steps for the dummy gate ensures that an active transistor is not formed at the location in the layout of the dummy gate. In some implementations, standard cell layouts use dummy gates at the edges of the cell layout. In these cases, dummy gates are typically used to separate cells from one another. For example, an edge of a cell has a last active metal gate, followed by active diffusion, and then a dummy gate. In some designs, two adjacent cells share a dummy gate.

In some implementations, the devices in the standard cell layout 100 are fabricated by one of the immersion lithography techniques, the double patterning technique, the extreme ultraviolet lithography (EUV) technique, and the directed self-assembly (DSA) lithography technique. These techniques provide the resolution of each of the width and the pitch of the layout such as the horizontal Metal0 130 routes. For example, The EUV technique uses an extreme ultraviolet wavelength to reach resolution below 40 nanometers. The extreme ultraviolet wavelength is approximately 13.5 nanometers. When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for at least the width and the pitch of the horizontal Metal0 130. Accordingly, one of a variety of lithography techniques is used to provide relatively high resolution for the width and the pitch.

The above techniques and newer techniques are allowing a relatively high resolution for the width and the pitch of the other layout layers besides the horizontal Metal0 130. For example, while still achieving a processing yield above a threshold, the relatively high resolution for the width and the pitch of Metal1 150 is obtained. Therefore, the maximum ratio of a number of vertical Metal1 150 tracks to a number of vertical metal gate 110 tracks can reduce to one. For a standard cell, this ratio of a first number of Metal1 150 tracks that can fit in an area with a minimum width for Metal1 150 tracks to a second number of metal gate 110 tracks that can fit in the area with a minimum width for metal gate 110 tracks and still provide a processing yield above a threshold is referred to as the "gear ratio". Each of the first number and the second number is a positive, non-zero integer. A two-to-one (2:1) gear ratio can be achieved.

A 2:1 gear ratio provides a number of contacted gate pitches (CPP) for metal one power posts of one, or 1 CPP. For example, the 2:1 gear ratio provides a metal one power post between metal gates 110 and a metal one input or output signal over a metal gate 110. Therefore, from a left edge of a metal gate 110 to a left edge of another metal gate 110, there is space for two signals in the metal one layer 150 to be placed. With a single metal one power post between a pair of metal gates 110, a metal one power post CPP of 1 is achieved. Although a few locations have been highlighted on layout 100 for using metal one power post CPP of 1 CPP, it is noted that it is possible and contemplated that each placement of a power post in Metal1 150 is capable of using 1 CPP. It is also noted that although the above description is for a metal one power post CPP of 1, these power posts are also used for connections to a ground reference voltage level. Therefore, a metal one power post CPP applies to connections used for power supply voltage levels and to connections used for ground reference voltage levels.

Layout 100 uses horizontal Metal0 130 power rails underneath the horizontal Metal2 160 power rails. Layout 100 also uses minimum length vertical Metal1 150 power posts. The minimum length is set by design rules. As described above, these vertical Metal1 150 power posts are placed in a manner to achieve metal one power post CPP of 1 CPP for layout 100. As the metal one power post CPP decreases from 4 CPP to 2 CPP to 1 CPP, the number of vias (contacts) 162 increases, so the overall resistance of vias 162 decreases. For example, the resistance of the vias 162 is halved with each reduction in the metal one power post CPP. The actual resistance of an individual via 162 remains the same. However, the overall resistance of all of the vias 162 used to connect the horizontal Metal2 160 power rails to the vertical Metal1 150 power posts reduces as the number of vias 162 increases. The same amount of current is being conducted from the horizontal Metal2 160 power rails to the vertical Metal1 150 power posts. However, as the overall resistance of all of the vias 162 decreases, the voltage droop also decreases.

In the illustrated implementation, the layout 100 uses 20 metal gates 110 between the dummy gates at the far ends. Four of the twenty metal gates 110 are used for a first inverter of the back-to-back inverters that receives the input data, or input signal. Sixteen of the twenty metal gates 110 are used for a second inverter of the back-to-back inverters that conveys the output data, or output signal. The "drive" of a standard cell is defined as a ratio of a number of metal gates 110 used to convey an output to a single metal gate 110. This ratio provides a measurement of an amount of current that the standard cell consumes from the horizontal Metal2 160 power rails through the vertical Metal1 150 power posts to provide the output signal. This ratio is also referred to as the "drive" of the standard cell. The drive of the back-to-back inverters (or buffer) of layout 100 is 16. Typically, for standard cells with a drive of 8 or more, the simultaneous switching of the metal gates 110 on the output node that causes current to be drawn from the horizontal Metal2 160 power rails through the vertical Metal1 150 power posts causes voltage droop. However, the placement of the vertical Metal1 150 power posts using metal one power post CPP of 1 CPP reduces voltage droop.

The simultaneous switching of a wide bus causes a significant voltage drop if a supply pin served all of the line buffers on the bus. This voltage droop, ΔV, is proportional to the expression L di/dt, wherein L is the parasitic inductance and di/dt is the time rate of change of the current consumption. If a large number of nodes in addition to buses switched simultaneously, a significant voltage drop is possible. Now a node that holds a logic high value is capable of experiencing a voltage droop that reduces its voltage value below a minimum threshold. For memories and latches without recovery circuitry, it is possible for stored values to be lost. The use of placing the vertical Metal1 150 power posts with 1 CPP reduces the voltage droop. If the voltage droop is reduced to a value below a threshold value, then performance increases, data corruption is avoided, and the semiconductor fabrication process avoids using backside power rails and through silicon vias (TSVs) that are expensive.

Figure 2:
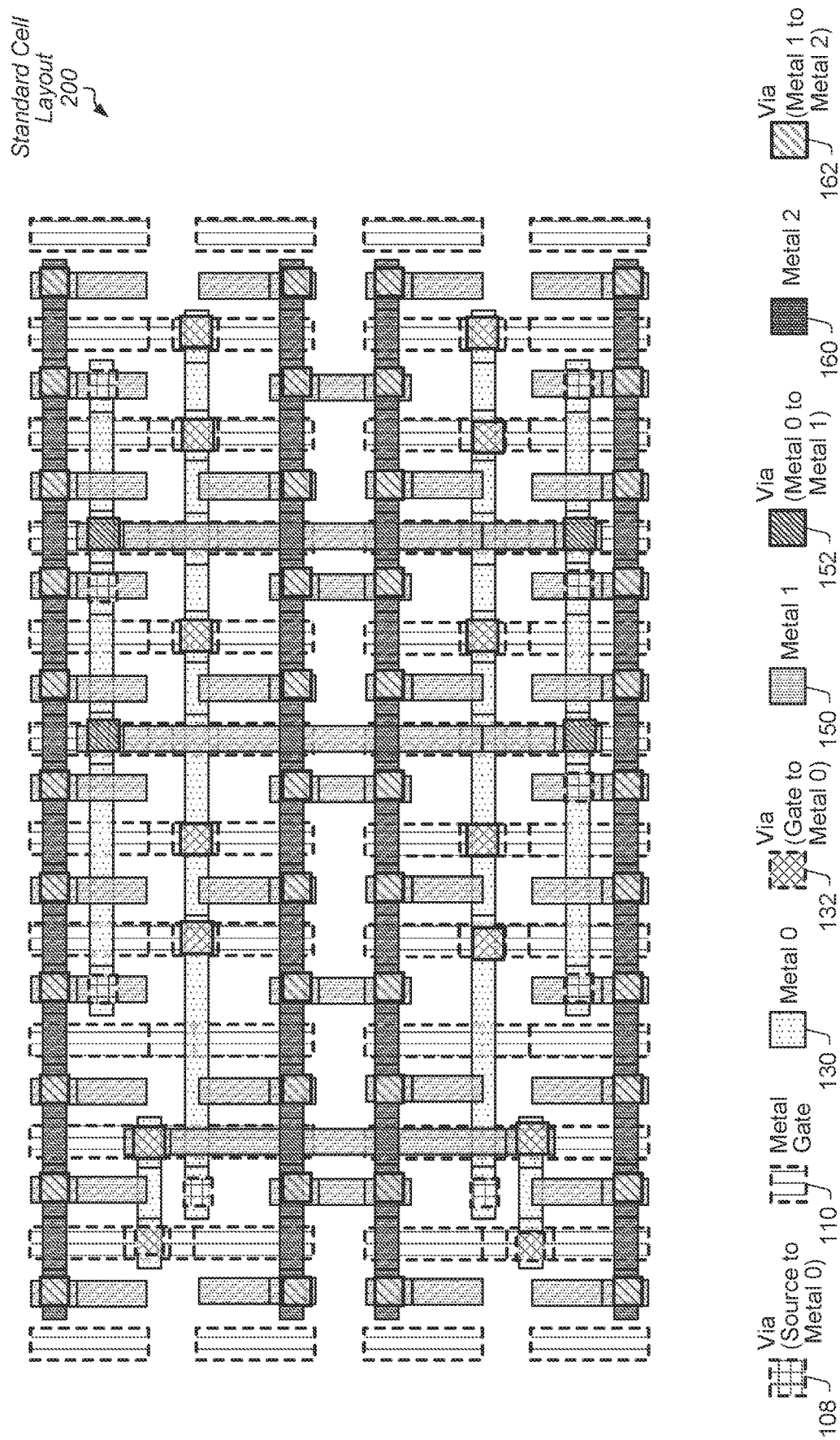
FIG. 2 is a generalized diagram of a top view of a standard cell layout utilizing techniques to reduce voltage droop.

Referring to FIG. 2, a generalized block diagram of a top view of a standard cell layout 200 is shown that utilizes techniques to reduce voltage droop. Layout elements and materials described earlier are numbered identically. In the illustrated implementation, the standard cell layout 200 is for a buffer with back-to-back inverters. However, in other implementations, the characteristics and techniques used for standard cell layouts 100 (of FIG. 1) and 200 are used for a variety of other types of Boolean gates and complex gates. Here, active regions are not shown for ease of illustration in the standard cell layout 200. Similar to layout 100 (of FIG. 1), the p-type devices are formed at the top of the standard cell layout 200, and the n-type devices are at the bottom of the standard cell layout 200 (or layout 200). Here in layout 200, the vertical Metal1 150 power posts are placed with 1 CPP. In layout 200, the vias (or contacts) 108 and the vias 132 are shown. The vias 108 connect the source regions implemented by trench silicide contacts (not shown) to the horizontal Metal0 130 layer. The vias 132 connect the metal gate 110 to the horizontal Metal0 130 layer.

Layout 200 uses multiple power rails to provide a same voltage reference level. For example, the two horizontal Metal2 160 power rails in the middle of layout 200 provide a same first voltage reference level. This first voltage reference level is one of multiple power supply voltage reference levels and ground reference voltage levels used by the circuitry of the buffer corresponding to the layout 200. The two horizontal Metal2 160 power rails at the top of layout 200 and at the bottom of layout 200 provide a same second voltage reference level. This second voltage reference level is different from the first voltage reference level. This second voltage reference level is one of multiple power supply voltage reference levels and ground reference voltage levels used by the circuitry of the buffer corresponding to the layout 200.

The layout 200 uses a dual height approach. For example, the layout 200 has twice the height of the single height layout 100 (of FIG. 1) and half the width of the single height layout 100. When using dual height, each of the horizontal Metal2 160 power rails has a reduced length and a smaller number of vertical Metal1 150 power posts connected to it for driving an output signal. Since the number of nodes capable of simultaneously switching is reduced, voltage droop is also reduced. The combination of placing the vertical Metal1 150 power posts with 1 CPP and using a dual height layout topology that reduces both the length and the via 162 connections on the horizontal Metal2 160 power rails greatly reduces the voltage droop.

Figure 3:
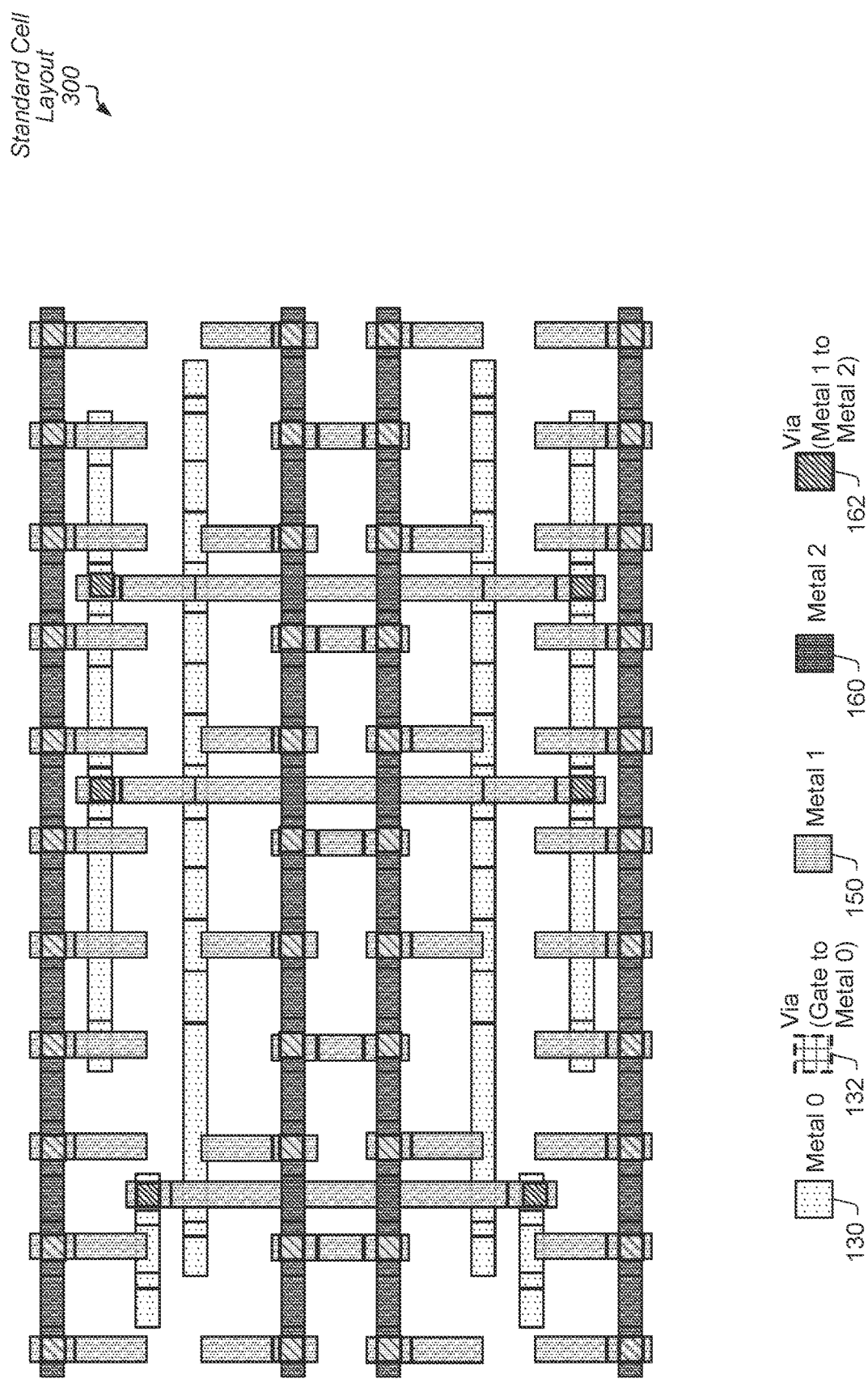
FIG. 3 is a generalized diagram of a top view of a standard cell layout utilizing techniques to reduce voltage droop.

Referring to FIG. 3, a generalized block diagram of a top view of a standard cell layout 300 is shown that utilizes techniques to reduce voltage droop. Layout elements and materials described earlier are numbered identically. In the illustrated implementation, the standard cell layout 300 is for a buffer with back-to-back inverters. The layout 300 is the same as layout 200, but some layout elements are removed for further ease of illustration. For example, the vias 108 and the vias 132 are removed. It is noted that the placement of the vertical Metal1 150 power posts connected to the two horizontal Metal2 160 power rails at the top of layout 300 and at the bottom of layout 300 include routing the vertical Metal1 150 power posts into the cell. This placement allows on-die area for neighboring cells to be placed.

It is also noted that the placement of the vertical Metal1 150 power posts connected to the two horizontal Metal2 160 power rails in the middle of layout 300 alternate between two Metal1 power posts routed into the cell and a single Metal1 power posts connecting the two Metal2 160 power rails to one another. Using a single Metal1 150 power post reduces capacitance for the power post and aids the conduction of current through the two Metal2 160 power rails. However, using two Metal1 150 power posts aids creating power connections in the cell.

Figure 4:
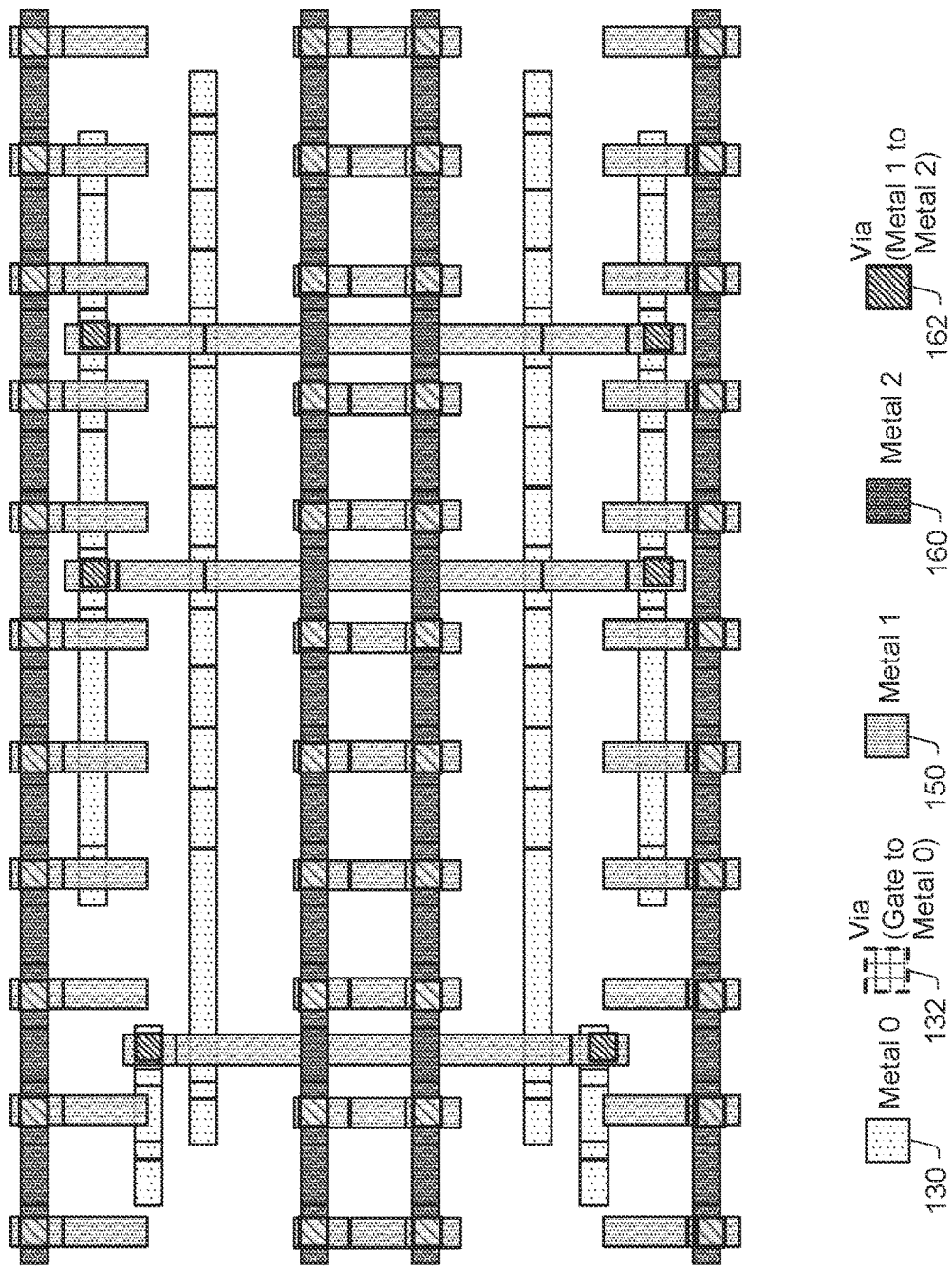
FIG. 4 is a generalized diagram of a top view of a standard cell layout utilizing techniques to reduce voltage droop.

Referring to FIG. 4, a generalized block diagram of a top view of a standard cell layout 400 is shown that utilizes techniques to reduce voltage droop. Layout elements and materials described earlier are numbered identically. Similar to the layouts 100-300, in the illustrated implementation, the standard cell layout 400 is for a buffer with back-to-back inverters. The layout 400 is the same as layout 300, but the placement of the vertical Metal1 150 power posts connected to the two horizontal Metal2 160 power rails in the middle of layout 400 do not alternate. Rather, each Metal1 150 power post is a single Metal1 power post connecting the two Metal2 160 power rails to one another. As described earlier, using a single Metal1 150 power post reduces capacitance for the power post and aids the conduction of current through the two Metal2 160 power rails. Therefore, voltage droop further reduces.

Figure 5:
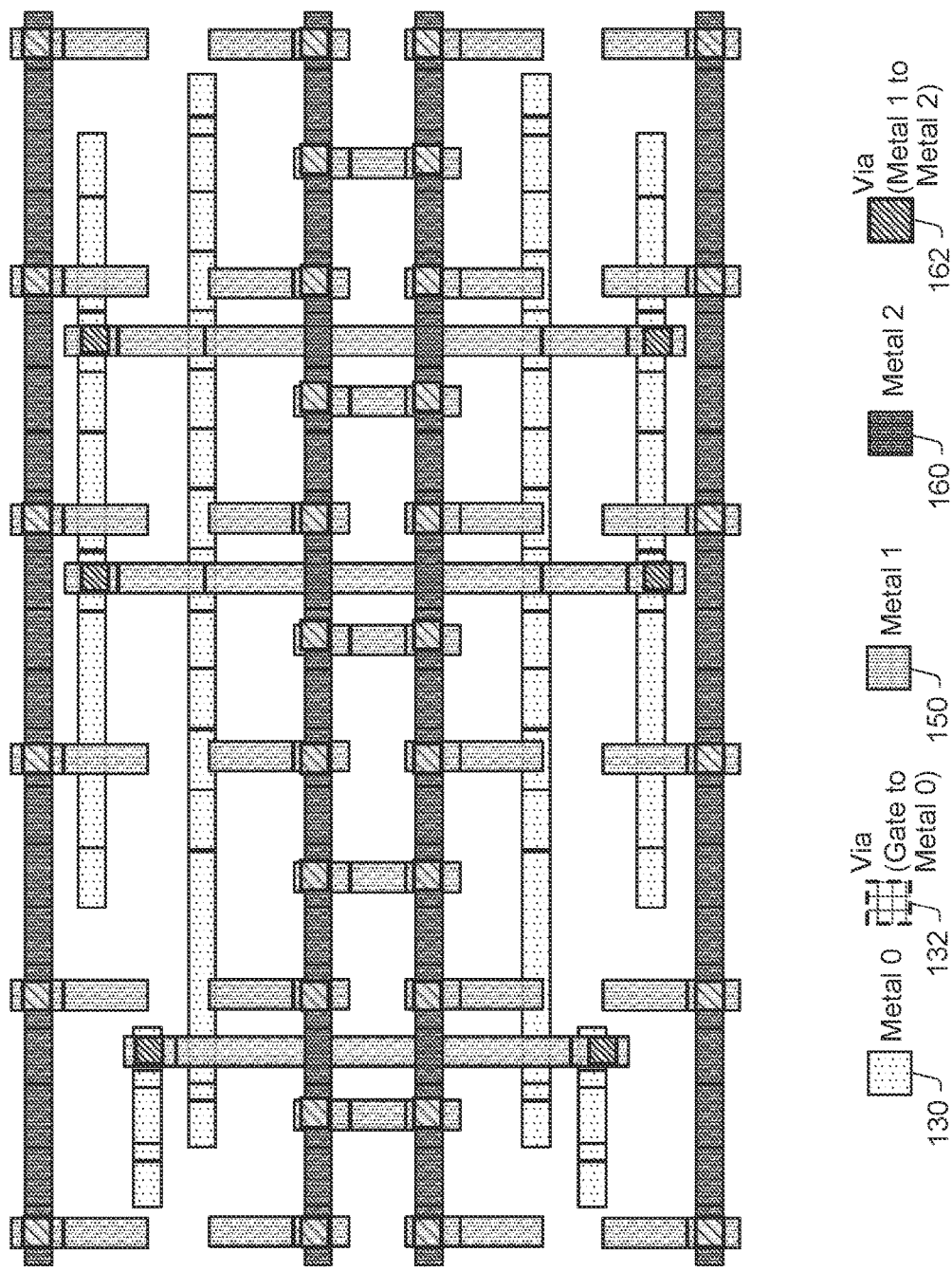
FIG. 5 is a generalized diagram of a top view of a standard cell layout utilizing techniques to reduce voltage droop.

Referring to FIG. 5, a generalized block diagram of a top view of a standard cell layout 500 is shown that utilizes techniques to reduce voltage droop. Layout elements and materials described earlier are numbered identically. Similar to the layouts 100-400, in the illustrated implementation, the standard cell layout 500 is for a buffer with back-to-back inverters. The layout 500 is the same as layout 400, but the placement of the vertical Metal1 150 power posts connected to the two horizontal Metal2 160 power rails at the top of layout 500 and at the bottom of layout 500 uses metal one power post CPP of 2 CPP, rather than 1 CPP. In some cases, using the dual height topology and using placement of 1 CPP for the Metal1 150 power posts in the middle of the layout 500 is sufficient to reduce the voltage droop below a threshold value. Therefore, the placement of the vertical Metal1 150 power posts at the top and the bottom of layout 500 can use another value of metal one power post CPP besides 1 CPP. In the illustrated implementation, a placement using a metal one power post CPP of 2 CPP is shown. In other implementations, a placement using a metal one power post CPP of 3 CPP or other is possible and contemplated.

Figure 6:
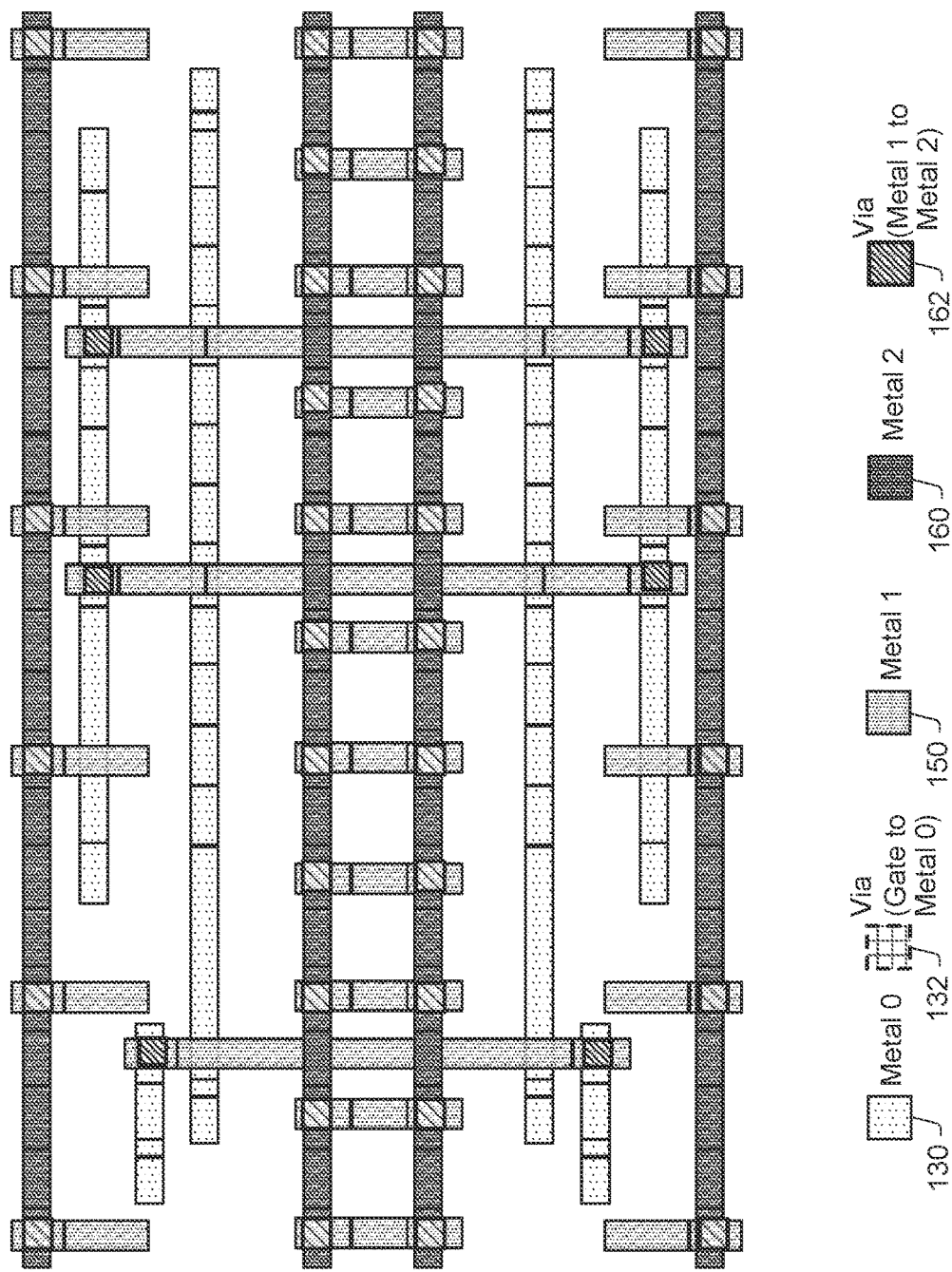
FIG. 6 is a generalized diagram of a top view of a standard cell layout utilizing techniques to reduce voltage droop.

Referring to FIG. 6, a generalized block diagram of a top view of a standard cell layout 600 is shown that utilizes techniques to reduce voltage droop. Layout elements and materials described earlier are numbered identically. Similar to the layouts 100-500, in the illustrated implementation, the standard cell layout 600 is for a buffer with back-to-back inverters. However, in other implementations, the characteristics and techniques used for standard cell layouts 100-500 and 600 are used for a variety of other types of Boolean gates and complex gates. The layout 600 is the same as layout 500, but the placement of the vertical Metal1 150 power posts connected to the two horizontal Metal2 160 power rails in the middle of layout 600 do not alternate. Rather, each Metal1 150 power post is a single Metal1 power post connecting the two Metal2 160 power rails to one another. As described earlier, using a single Metal1 150 power post reduces capacitance for the power post and aids the conduction of current through the two Metal2 160 power rails in the middle of the layout 600. Therefore, voltage droop further reduces.

Figure 7:
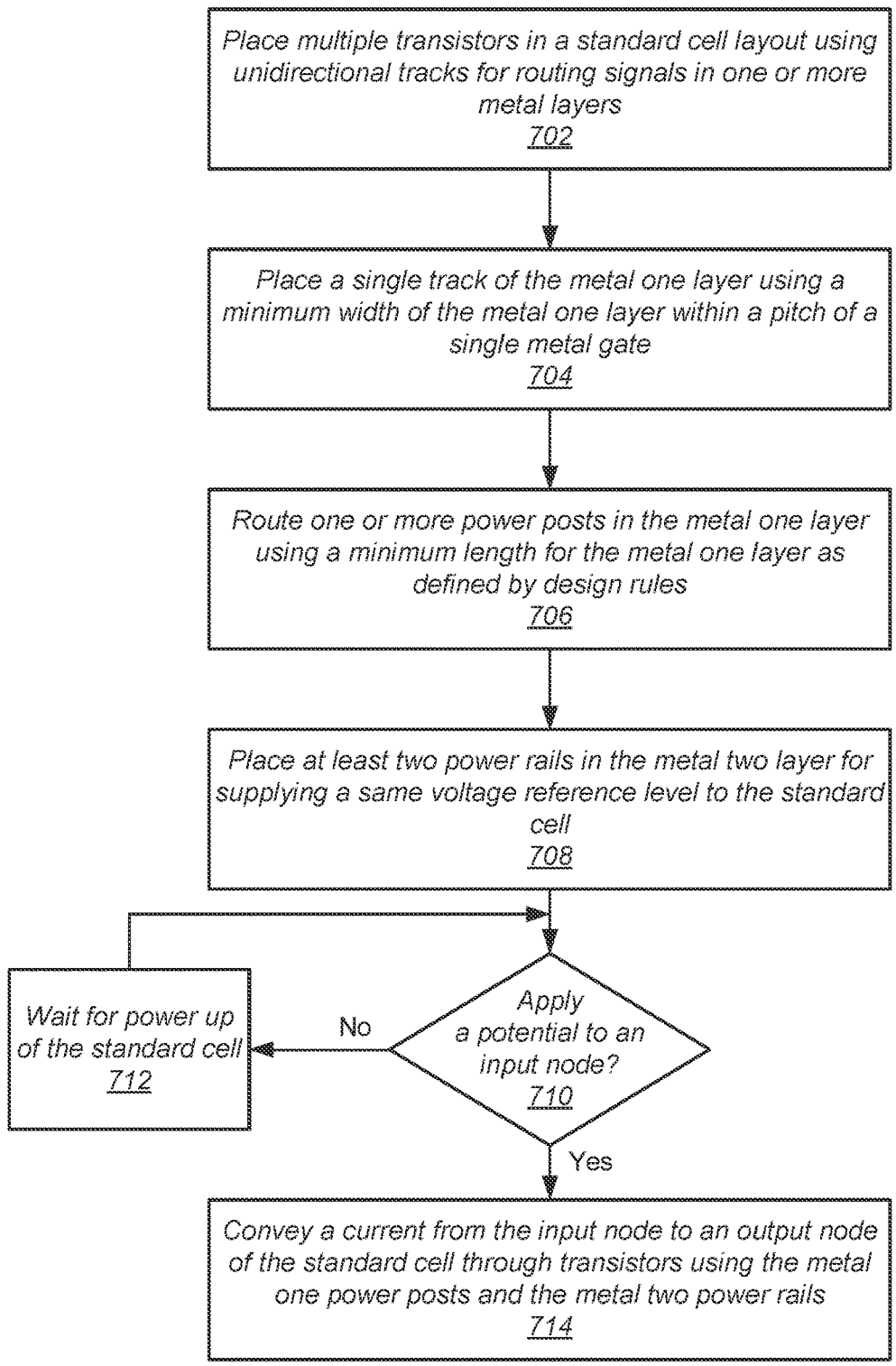
FIG. 7 is a generalized diagram of a method for creating layout for a standard cell that utilizes techniques to reduce voltage droop.

Referring now to FIG. 7, one implementation of a method 700 is shown for efficiently creating a layout for a standard cell that utilizes techniques to reduce voltage droop. For purposes of discussion, the steps in this implementation are shown in sequential order. However, in other implementations some steps occur in a different order than shown, some steps are performed concurrently, some steps are combined with other steps, and some steps are absent.

One or more of a custom cell designer and an automated synthesis tool places multiple transistors in a standard cell layout using unidirectional tracks for routing signals in one or more metal layers (block 702). A single track of the metal one layer using a minimum width of the metal one layer is placed within a pitch of a single metal gate (block 704). As described earlier, power posts of the metal one layer are placed in a manner to achieve a metal one power post CPP of 1 CPP for layout of the standard cell. As the metal one power post CPP decreases from 4 CPP to 2 CPP to 1 CPP, the number of vias (contacts) used to connect the metal one power posts to the metal two power rails increases. As the number of these vias increases, the overall resistance of these vias decreases, which reduces the voltage droop.

In addition to the above, the method is configured to route one or more power posts in the metal one layer using a minimum length for the metal one layer as defined by design rules (block 706). The minimum length reduces electromigration effects and provides area for signal routing for neighboring cells. A custom cell designer or an automated synthesis tool routes, in a metal one track, the power posts using the minimum length. At least two power rails in the metal two layer are placed for supplying a same voltage reference level to the standard cell (block 708). As described earlier, the standard cell uses a dual height approach with two metal two power rails in the middle of the standard cell and two other metal two power rails at the top and the bottom of the standard cell. The two middle metal two power rails provide a same first voltage reference to the standard cell. The first voltage reference level is one of the multiple power supply voltage reference levels and the ground voltage reference levels used by the standard cell. The two metal two power rails at the top and the bottom of the standard cell provide a same second voltage reference level to the standard cell that is different from the first voltage reference level.

In some implementations, the standard cell uses only the placement of metal one power posts with 1 CPP without using the dual height approach. In other implementations, the dual height approach is used, but a set of metal one power posts for a particular voltage reference level is not placed with 1 CPP, whereas, another set of metal one power posts for another voltage reference level is placed with 1 CPP. In yet other implementations, when using the dual height approach, each of the metal one power posts connected to the two metal two power rails in the middle of the standard cell is connected to each of the metal two power rails. In another implementation, when using the dual height approach, each of the metal one power posts connected to the two metal two power rails in the middle of the standard cell is connected to only one of the metal two power rails. Alternating between these connections of the metal one power posts in the middle of the standard cell is also possible and contemplated.

When the standard cell exists either as a netlist for circuit simulation or as a physical, fabricated cell on a silicon chip die, the standard cell does not generate a signal on an output node until the one or more power connections receive a power supply voltage, the one or more ground reference connections receive a ground reference voltage, and the one or more input nodes receive a potential such as Boolean logic level. The Boolean logic level is one of a logic high level, such as the power supply voltage, or a logic low level such as the ground reference voltage. If a potential is not applied to an input node of the standard cell ("no" branch of the conditional block 710), then the standard cell waits for power up (block 712). However, if a potential is applied to the input node of the standard cell ("yes" branch of the conditional block 710), then the circuitry of the standard cell conveys a current from the input node to an output node of the standard cell through transistors using the metal one power posts and the metal two power rails (block 714).

Figure 8:
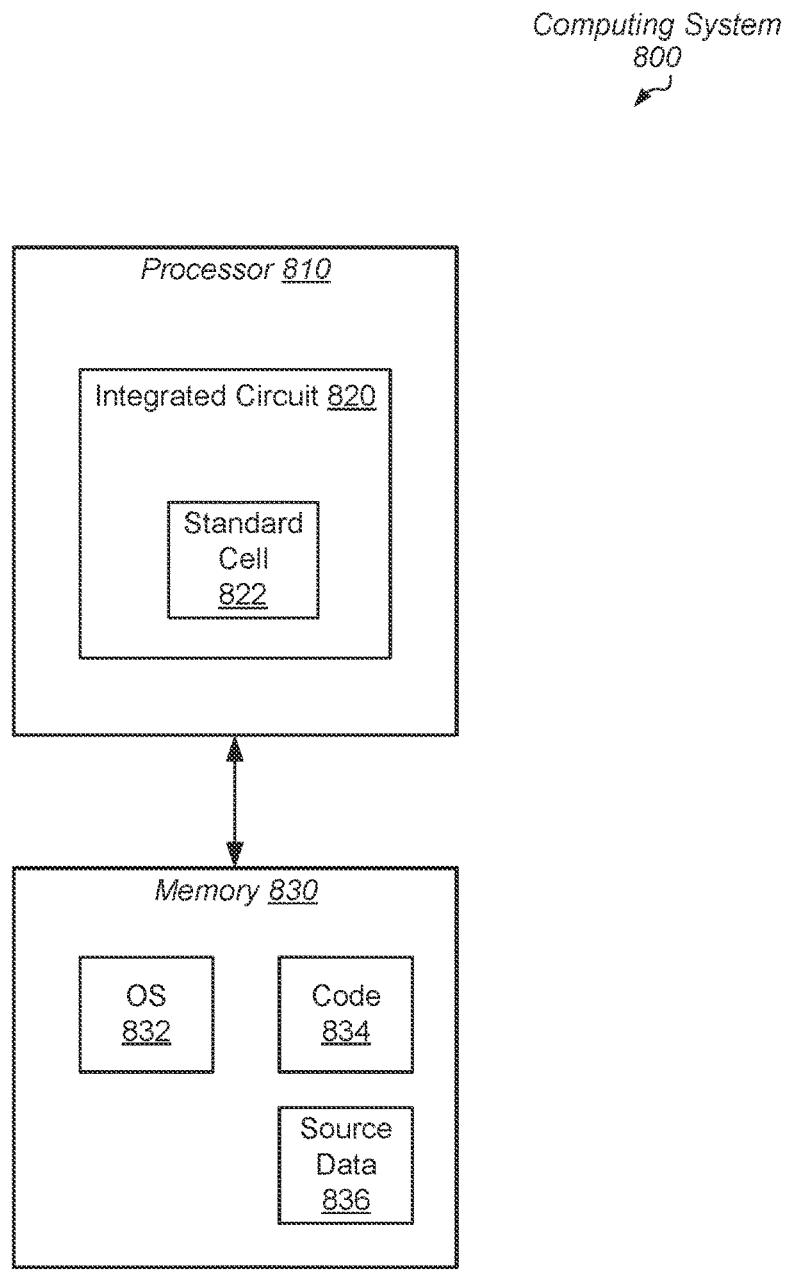
FIG. 8 is a generalized diagram of computing system with a processor that includes standard cells that utilize techniques to reduce voltage droop.

Referring to FIG. 8, one implementation of a computing system 800 is shown with a processor that includes standard cells that utilize techniques to reduce voltage droop. The computing system 800 includes the processor 810 and the memory 830. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 800 includes one or more of other processors of a same type or a different type than processor 810, one or more peripheral devices, a network interface, one or more other memory devices, and so forth. In some implementations, the functionality of the computing system 800 is incorporated on a system on chip (SoC). In other implementations, the functionality of the computing system 800 is incorporated on a peripheral card inserted in a motherboard. The computing system 800 is used in any of a variety of computing devices such as a desktop computer, a tablet computer, a laptop, a smartphone, a smartwatch, a gaming console, a personal assistant device, and so forth.

The processor 810 includes hardware such as circuitry. For example, the processor 810 includes at least one integrated circuit 820, which utilizes at least standard cell 822. For example, one or more standard cells are instantiated in the integrated circuit 820. These standard cells utilize the characteristics and techniques described earlier for standard cell layouts 100-600 (of FIGS. 1-6). In various implementations, the processor 810 includes one or more processing units. In some implementations, each of the processing units includes one or more processor cores capable of general-purpose data processing, and an associated cache memory subsystem. In such an implementation, the processor 810 is a central processing unit (CPU). In another implementation, the processing cores are compute units, each with a highly parallel data microarchitecture with multiple parallel execution lanes and an associated data storage buffer. In such an implementation, the processor 810 is a graphics processing unit (GPU), a digital signal processor (DSP), or other.

In some implementations, the memory 830 includes one or more of a hard disk drive, a solid-state disk, other types of flash memory, a portable solid-state drive, a tape drive and so on. The memory 830 stores an operating system (OS) 832, one or more applications represented by code 834, and at least source data 836. Memory 830 is also capable of storing intermediate result data and final result data generated by the processor 810 when executing a particular application of code 834. Although a single operating system 832 and a single instance of code 834 and source data 836 are shown, in other implementations, another number of these software components are stored in memory 830. The operating system 832 includes instructions for initiating the boot up of the processor 810, assigning tasks to hardware circuitry, managing resources of the computing system 800 and hosting one or more virtual environments.

Each of the processor 810 and the memory 830 includes an interface unit for communicating with one another as well as any other hardware components included in the computing system 800. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit with one or more standard cells comprising:
   a plurality of transistors;
   a plurality of unidirectional signal routes in each of a metal zero layer and a metal one layer; and
   wherein at least one of the plurality of transistors includes a single track of the metal one layer within a pitch of a single metal gate, the single track of the metal one layer including a power post of the metal one layer connected to a first power rail of a metal two layer; and
   wherein responsive to a potential being applied to an input node of a given standard cell of the one or more standard cells, a current is conveyed from the input node to an output node of the given standard cell through the single track of the metal one layer within the pitch of the single metal gate.

2. The integrated circuit as recited in claim 1, wherein:
   the single track of the metal one layer uses a minimum width of the metal one layer; and
   the pitch of the single metal gate uses a minimum width of the metal gate.

3. The integrated circuit as recited in claim 1, wherein each of the plurality of transistors includes a single track of the metal one layer with a power post of the metal one layer within the pitch of the single metal gate.

4. The integrated circuit as recited in claim 1, wherein the metal zero layer provides for local interconnections adjacent to an active region.

5. The integrated circuit as recited in claim 1, further comprising the first power rail in a first track of the metal two layer and a second power rail in a second track different from the first track of the metal two layer, each of the first power rail and the second power rail providing a first voltage reference to the given standard cell.

6. The integrated circuit as recited in claim 5, wherein the power post of the metal one layer in the single track of the metal one layer is:
   routed with a minimum length; and
   connected to each of the first power rail and the second power rail of the metal two layer.

7. The integrated circuit as recited in claim 5, further comprising a third power rail in a third track of the metal two layer and a fourth power rail in a fourth track of the metal two layer, each of the third power rail and the fourth power rail providing a second voltage reference to the given standard cell.

8. A method comprising:
   placing, in an integrated circuit comprising one or more standard cells, a plurality of transistors;
   routing, in the integrated circuit, a plurality of unidirectional signal routes in each of a metal zero layer and a metal one layer;
   placing, for at least one of the plurality of transistors, a single track of the metal one layer within a pitch of a single metal gate, the single track of the metal one layer including a power post of the metal one layer connected to a first power rail of a metal two layer; and
   wherein responsive to a power supply voltage being applied to an input node of a given standard cell of the one or more standard cells, the integrated circuit is configured to convey a current from the input node to an output node of the given standard cell through the single track of the metal one layer.

9. The method as recited in claim 8, wherein:
   the single track of the metal one layer uses a minimum width of the metal one layer; and
   the pitch of the single metal gate uses a minimum width of the metal gate.

10. The method as recited in claim 8, wherein each of the plurality of transistors includes a single track of the metal one layer with a power post of the metal one layer within the pitch of the single metal gate.

11. The method as recited in claim 8, wherein the metal zero layer provides for local interconnections adjacent to an active region.

12. The method as recited in claim 8, wherein the integrated circuit further comprises the first power rail in a first track of the metal two layer and a second power rail in a second track different from the first track of the metal two layer, each of the first power rail and the second power rail providing a first voltage reference to the given standard cell.

13. The method as recited in claim 12, wherein the power post of the metal one layer in the single track of the metal one layer is:
   routed with a minimum length; and
   connected to each of the first power rail and the second power rail of the metal two layer.

14. The method as recited in claim 12, wherein the integrated circuit further comprises a third power rail in a third track of the metal two layer and a fourth power rail in a fourth track of the metal two layer, each of the third power rail and the fourth power rail providing a second voltage reference to the given standard cell.

15. A computing system comprising:

a memory configured to store instructions of one or more tasks;

an integrated circuit, comprising one or more standard cells, configured to execute the instructions, wherein the integrated circuit comprises:

a plurality of transistors;

a plurality of unidirectional signal routes in each of a metal zero layer and a metal one layer; and wherein at least one of the plurality of transistors includes a single track of the metal one layer within a pitch of a single metal gate, the single track of the metal one layer including a power post of the metal one layer connected to a first power rail of a metal two layer; and wherein responsive to a potential being applied to an input node of a given standard cell of the one or more standard cells, a current is conveyed from the input node to an output node of the given standard cell through the single track of the metal one layer within the pitch of the single metal gate.

16. The computing system as recited in claim 15, wherein:

the single track of the metal one layer uses a minimum width of the metal one layer; and the pitch of the single metal gate uses a minimum width of the metal gate.

17. The computing system as recited in claim 15, wherein each of the plurality of transistors includes a single track of the metal one layer with a power post of the metal one layer within the pitch of the single metal gate.

18. The computing system as recited in claim 15, wherein the the metal zero layer provides for local interconnections adjacent to an active region.

19. The computing system as recited in claim 18, wherein the power post of the metal one layer in the single track of the metal one layer is:

routed with a minimum length; and connected to each of the first power rail and a second power rail of the metal two layer.

20. The computing system as recited in claim 15, wherein the integrated circuit further comprises the first power rail in a first track of the metal two layer and a second power rail in a second track different from the first track of the metal two layer, each of the first power rail and the second power rail providing a first voltage reference to the given standard cell.

* * * * *

UNITED STATES PATENT AND TRADEMARK OFFICE
CERTIFICATE OF CORRECTION

PATENT NO. : 12,205,897 B2
APPLICATION NO. : 17/483672
DATED : January 21, 2025
INVENTOR(S) : Richard T. Schultz Page 1 of 1

It is certified that error appears in the above-identified patent and that said Letters Patent is hereby corrected as shown below:

In the Claims

Column 14, Claim 18, Line 11, please delete "the the metal zero layer" and substitute -- the metal zero layer --.

Signed and Sealed this
Sixth Day of May, 2025

Coke Morgan Stewart
*Acting Director of the United States Patent and Trademark Office*